United States Patent [19]
Huang et al.

[11] Patent Number: 6,022,457
[45] Date of Patent: Feb. 8, 2000

[54] METHOD OF MANUFACTURING COBALT SILICIDE LAYER

[75] Inventors: Hsin-Yuan Huang, Taoyuan; Yuan-Ching Peng; Lih-Juann Chen, both of Hsinchu; Yong-Fen Hsieh, Hsinchu Hsien, all of Taiwan

[73] Assignee: United Microelectronics Corp., Hsinchu, Taiwan

[21] Appl. No.: 09/045,980

[22] Filed: Mar. 18, 1998

[30] Foreign Application Priority Data

Dec. 24, 1997 [TW] Taiwan .................................. 86119671

[51] Int. Cl.$^7$ ..................................................... C23C 14/34
[52] U.S. Cl. .................... 204/192.17; 438/680; 438/682; 438/763; 427/255.27; 427/255.4; 427/376.2
[58] Field of Search ................................. 427/255, 255.4, 427/255.7, 376.2, 255.27; 204/192.17; 438/680, 682, 763

[56] References Cited

U.S. PATENT DOCUMENTS 5,047,367 9/1991 Wei et al. ................................. 437/200
5,266,156 11/1993 Nasr ......................................... 156/656

*Primary Examiner*—Timothy Meeks

[57] ABSTRACT

A method of manufacturing a cobalt suicide layer in the present invention has a silicon layer formation step. The silicon layer is formed at the interface between the cobalt layer and titanium layer, therefore the interface is smoother in this invention than in other conventional methods, and there are no voids formed at the interface. Moreover, consumption of the silicon can be controlled by adjusting the thickness of the silicon layer.

9 Claims, 3 Drawing Sheets

METHOD OF MANUFACTURING COBALT SILICIDE LAYER

CROSS-REFERENCE TO RELATED APPLICATION

This application claims the priority benefit of Taiwan application serial no. 86119671, filed Dec. 24, 1997, the full disclosure of which is incorporated herein by reference.

BACKGROUND OF THE INVENTION

1. Field of the Invention

The invention relates in general to the fabrication of a self-aligned silicide and more particularly to a method of manufacturing a cobalt silicide ($CoSi_2$) layer.

2. Description of the Related Art

As the level of integration for MOS devices increases, resistance in the source/drain terminals of the MOS device gradually rises to a value comparable to the channel resistance of the MOS device. To ensure integrity at the shallow junction between metallic contacts and the MOS terminals, and for the downward adjustment of sheet resistance in the source/drain terminals, self-aligned silicide processes are now employed in the manufacturing of very large scale integrated (VLSI) circuits, especially for the manufacturing of semiconductor devices having a line width smaller than about 0.5 $\mu$m.

Titanium is the metal material most frequently used for the self-aligned silicide. However, it is not easy to control the silicide step at the high temperature needed for the titanium salicide process. Moreover, the temperature used to transform the titanium metal into titanium silicide is very high. As the size of the titanium silicide is diminished, high temperature is needed to transform the phase completely, but high temperature bring about thermal unstability. In response to these problems cobalt silicide can be used to displace the titanium silicide in the future, because it has a low silicide temperature and low resistance. However, large amounts of silicon are consumed during the formation of the cobalt silicide, and it is not easy to control junction depth. Moreover, the formation of cobalt silicide is degraded by the native oxide formed on the surface of the silicon substrate.

FIGS. 1A to 1B are cross-sectional views showing a progression for manufacturing a cobalt silicide layer by using a cobalt/silicon structure according to a conventional method.

First, as shown in FIG. 1A, a silicon substrate 10 is provided. The silicon substrate 10 is dipped in a buffer oxide etchant (BOE) solution with a 50:1 concentration to remove the native oxide formed on the surface of the silicon substrate 10. Then, a layer of cobalt metal 12 is formed, for example, by using a sputtering method, over the silicon substrate 10. The sputtering method comprises, for example, a DC magnetically controlled sputtering method, at a base pressure of about $2 \times 10^{-7}$ torr.

Next, referring to FIG. 1B, a thermal oxidation method is performed, for example, by using a rapid thermal process with nitrogen for about 30 sec, so that the cobalt layer 12 reacts with the silicon atoms on the surface of the substrate 10, forming a layer of cobalt silicide 14. Then, the unreacted and remaining cobalt metal are removed, for example, by using a wet etching method.

A conventional manufacturing method has several drawbacks including the roughness at the junction interface of the silicon substrate 10 and cobalt silicide layer 14, making it hard to control the junction depth. Additionally, the formation of the cobalt silicide is degraded by the native oxide formed on the surface of the substrate structure.

Another conventional manufacturing method comprises adding a layer of titanium to the interface between the cobalt layer and silicon substrate, thereby preventing the formation of the native oxide.

FIGS. 2A to 2B are cross-sectional views showing a progression for manufacturing a cobalt silicide layer by using a cobalt/titanium/silicon structure according to another conventional method.

First, as shown in FIG. 2A, a silicon substrate 20 is provided. Silicon substrate 20 is dipped in a buffer oxide etchant solution with a 50:1 concentration to remove the native oxide formed on the surface of the silicon substrate 20. Then, a layer of titanium metal 22 with a thickness of about 50–150 Å is formed, for example, by using a sputtering method, over the surface of the silicon substrate 20. Then, a layer of cobalt metal 24 is formed, for example, by using a sputtering method, over the titanium layer 22. The sputtering method comprises, for example, DC magnetically controlled sputtering method, at an base pressure of about $2 \times 10^{-7}$ torr.

Next, referring to FIG. 2B, a thermal annealing method is performed, for example, by using a rapid thermal process with nitrogen for about 30 sec, so that the cobalt layer 24 reacts with the silicon atoms on the surface of the substrate 20, forming a layer of cobalt silicide 26. Simultaneously, a layer of titanium-cobalt-silicon-oxygen mixture 28 is formed on the surface. Then, the unreacted and remaining cobalt metal are removed, for example, by using a wet etching method.

There is still a rough interface between the silicon substrate 20 and silicon cobalt layer 26 in this conventional method. Moreover, a large amount of silicon is consumed and voids are formed at the interface.

SUMMARY OF THE INVENTION

It is therefore an object of the invention to provide an improved and simplified process of manufacturing a cobalt silicide layer to improve the drawbacks of the conventional process.

The invention achieves the above-identified objects by providing a new method of manufacturing a cobalt silicide layer. This method comprises the following steps. First, a silicon substrate is provided. The substrate is cleaned in a buffer oxide etchant solution. Next, three layers are formed over the substrate in the following order: a titanium layer, a silicon layer and a cobalt layer. Finally, a thermal process is performed, so that the cobalt layer is transformed into the cobalt silicide layer.

A characteristic of this invention is the addition of the silicon layer to the position between the cobalt layer and titanium layer, therefore forming a smooth interface. Moreover, consumption of the silicon can be controlled by adjusting the thickness of the silicon layer. The cobalt silicide layer is an epitaxial phase.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
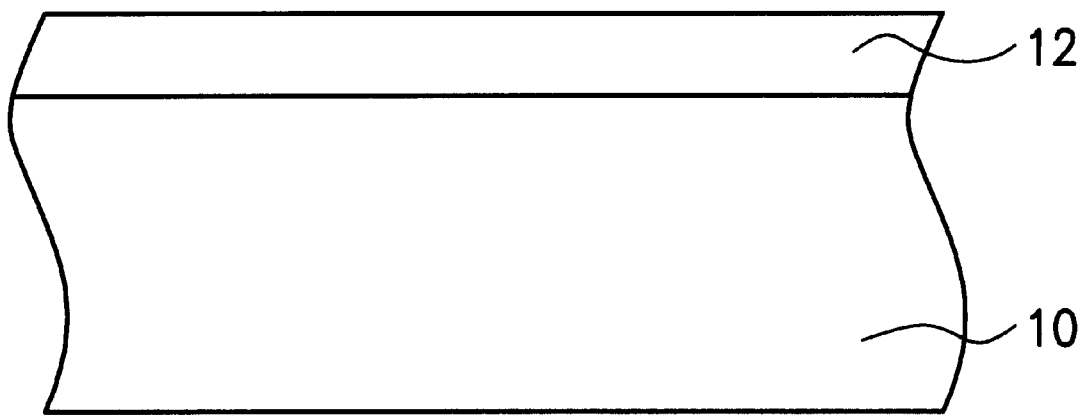
FIGS. 1A to 1B (Prior Art) are cross-sectional views showing a progression for manufacturing a cobalt suicide layer according to a conventional method.
Figure 1B:
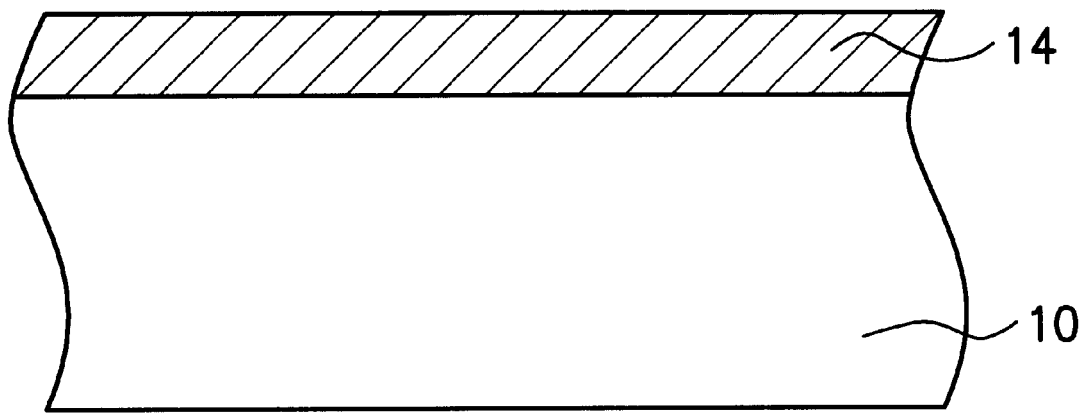
Figure 2A:
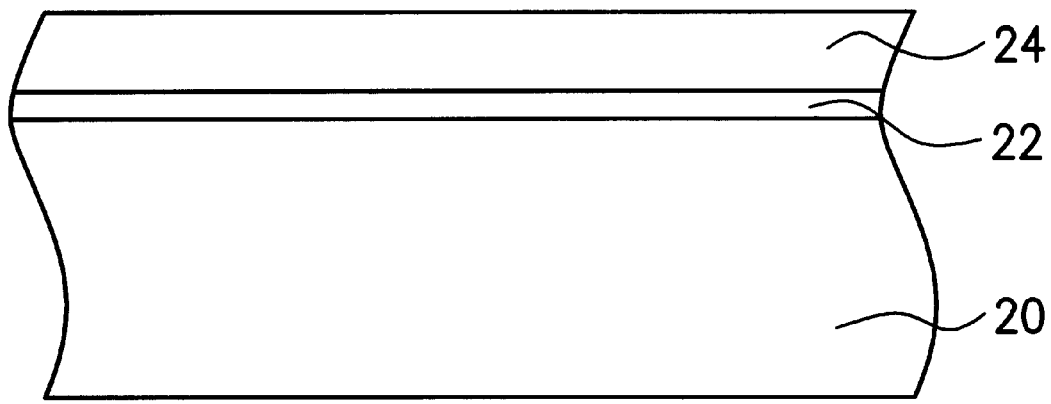
FIGS. 2A to 2B (Prior Art) are cross-sectional views showing a progression for manufacturing a cobalt suicide layer according to another conventional method.
Figure 2B:
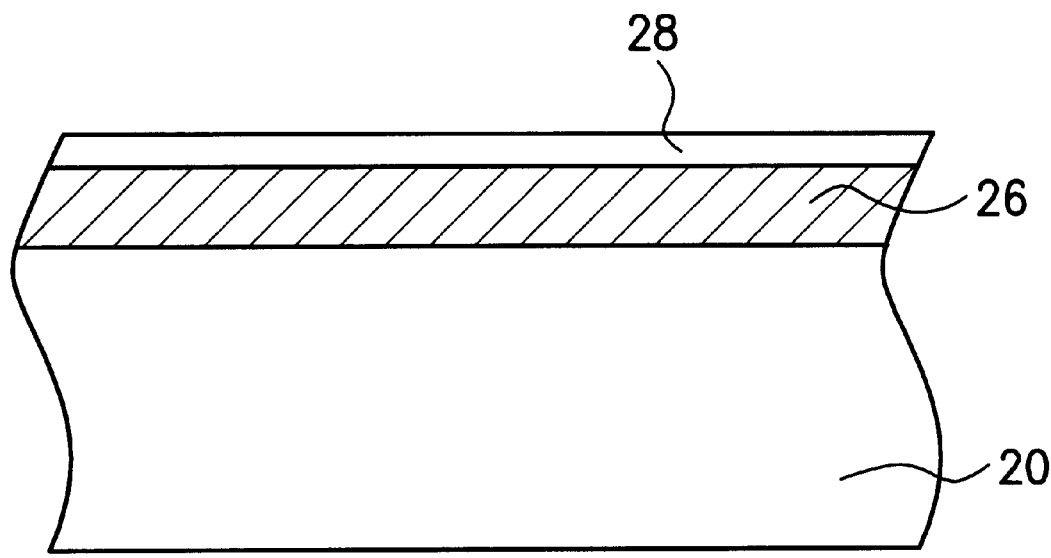
Figure 3A:
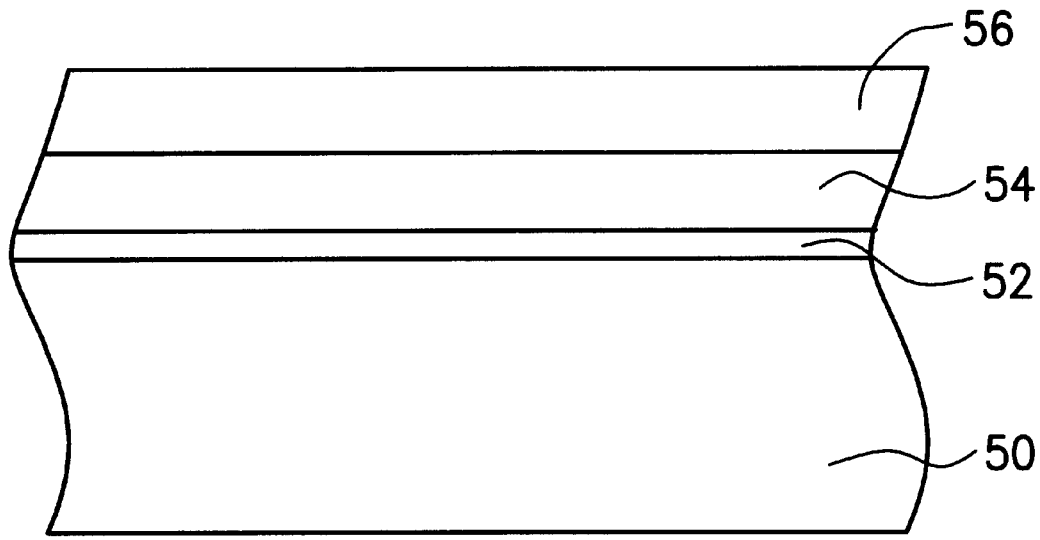
FIGS. 3A to 3B are cross-sectional views showing a progression for manufacturing a cobalt suicide layer according to a preferred embodiment of this invention.
Figure 3B:
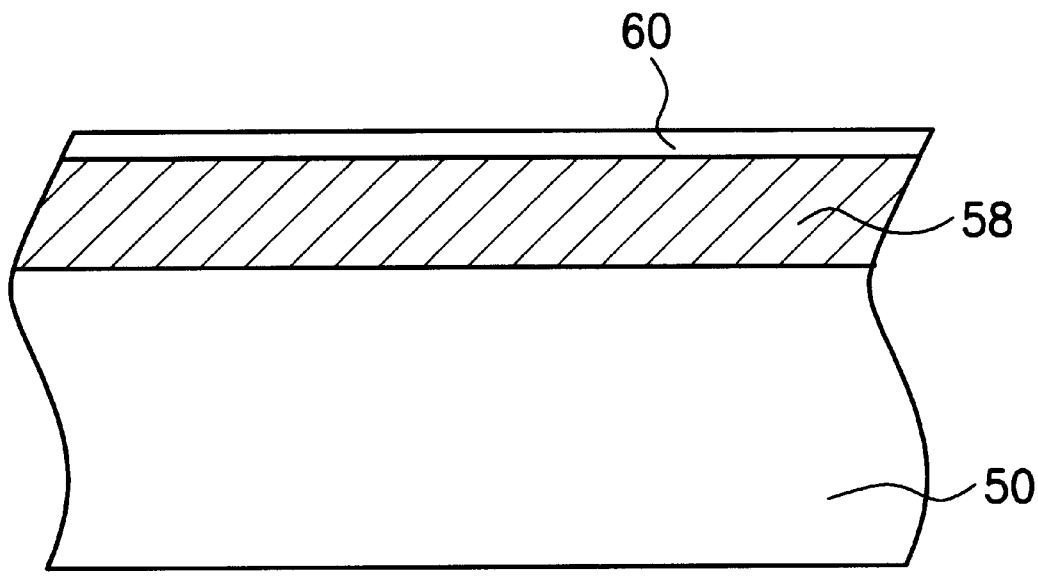

FIGS. 3A to 3B are cross-sectional views showing a progression for manufacturing a cobalt silicide layer according to a preferred embodiment of this invention.

First, as shown in FIG. 3A, a silicon substrate 50 is provided. The substrate 50 is dipped in a buffer oxide etchant solution with a 50:1 concentration to clean the silicon substrate 50 by, for example, removing the native oxide formed on the surface of the silicon substrate 50. Then, a layer of titanium metal 52 with a thickness of about 50–150 Å is formed, for example, by using a sputtering method, over the surface of the silicon substrate 50. A layer of silicon 54, for example, amorphous silicon, polysilicon, or silicon-contained layer is formed, for example, by using a chemical vapor deposition method, over the surface of the titanium layer 52.

A characteristic of this invention is that the silicon layer 54 is formed over the titanium layer 52, thus the surface of the substrate structure smoother, which in turn makes the interface between the substrate structure and cobalt layer formed in the subsequent step smoother too. The consumption of the silicon can be controlled by adjusting the thickness of the silicon layer 54.

Then, a layer of cobalt metal 56 is formed, for example, by using a sputtering method, over the silicon layer 54. The sputtering method comprises, for example, a DC magnetically controlled sputtering method, at an base pressure of about $2 \times 10^{-7}$ torr.

Referring to FIG. 3B, a thermal oxidation method is performed, for example, by using a rapid thermal process with nitrogen for about 30 sec, so that the cobalt atoms of the cobalt layer 56 react with the silicon atoms on the surface of the deposited silicon layer 54 and substrate 50 to form a layer of cobalt silicide 58. Simultaneously, an amorphous phase layer 60 of titanium-cobalt-silicon-oxygen mixture is formed on the surface. Then, the unreacted and remaining cobalt metal are removed, for example, by using a wet etching method. The cobalt silicide formed in the present invention is an epitaxial metal silicide.

The interface between the cobalt silicide layer 58 and the silicon substrate 50 is smoother in this invention than that formed in the conventional method, and there are no voids formed at the interface.

A characteristic of this invention is the addition of the silicon layer 54 to the position between the cobalt layer 56 and titanium layer 52, to form the smooth interface. Moreover, the consumption of the silicon can be controlled by adjusting the thickness of the silicon layer 54, and a cobalt silicide layer 58 having an epitaxial phase is formed.

While the invention has been described by way of example and in terms of a preferred embodiment, it is to be understood that the invention is not limited thereto. To the contrary, it is intended to cover various modifications and similar arrangements and procedures, and the scope of the appended claims should therefore be accorded the broadest interpretation so as to encompass all such modifications and similar arrangements and procedures.

What is claimed is:

1. A method of manufacturing a cobalt silicide layer, comprising the steps of:

providing a silicon substrate;

forming a titanium layer directly on the substrate;

forming a silicon layer directly on the titanium layer;

forming a cobalt layer directly on the silicon layer; and performing a thermal process, thereby transforming the cobalt layer into the cobalt silicide layer.

2. A method according to claim 1, wherein before the step of forming the titanium layer, the method further comprises dipping the silicon substrate in a buffer oxide etchant solution to clean the substrate.

3. A method according to claim 1, wherein the step of forming the titanium layer includes using a sputtering method.

4. A method according to claim 1, wherein the step of forming the silicon layer includes using a chemical vapor deposition method.

5. A method according to claim 1, wherein the step of forming the cobalt layer includes using a sputtering method.

6. A method according to claim 1, wherein the step of performing the thermal process includes using a rapid thermal process.

7. A method according to claim 1, wherein the step of performing the thermal process further comprises the step of transforming the titanium layer into an amorphous phase layer.

8. A method according to claim 7, wherein the amorphous phase layer comprises a cobalt-silicon-titanium binding structure.

9. A method according to claim 1, wherein the silicon layer comprises amorphous silicon.

* * * * *